United States Patent
Zhang et al.

(10) Patent No.: US 9,653,425 B2
(45) Date of Patent: May 16, 2017

(54) ANISOTROPIC CONDUCTIVE FILM STRUCTURES

(71) Applicant: Apple Inc., Cupertino, CA (US)

(72) Inventors: Bo Zhang, Cupertino, CA (US); Sang Ha Kim, Dublin, CA (US); Cyrus Y. Liu, Cupertino, CA (US); Kuo-Hua Sung, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/836,859

(22) Filed: Aug. 26, 2015

(65) Prior Publication Data

US 2017/0062379 A1    Mar. 2, 2017

(51) Int. Cl.

| H01L 23/48 | (2006.01) |
|---|---|
| H01L 23/52 | (2006.01) |
| H01L 29/40 | (2006.01) |
| H01L 23/00 | (2006.01) |

(52) U.S. Cl.
CPC .............. *H01L 24/83* (2013.01); *H01L 24/32* (2013.01); *H01L 2224/32227* (2013.01); *H01L 2224/83203* (2013.01); *H01L 2224/83851* (2013.01); *H01L 2224/83874* (2013.01); *H01L 2924/2075* (2013.01)

(58) Field of Classification Search
CPC . H01L 2021/60277; H01L 2224/40491; H01L 2224/48491; H01L 2224/8085; H01L 2224/8185; H01L 2224/8285; H01L 2224/8385; H01L 2224/8485; H01L 2224/8585; H01L 2224/8685; H01L 23/3142; H01L 23/53223; H01L 23/53238; H01L 23/53252; H01L 23/53266; H01L 24/26; H01L 24/04; H01L 24/05; H01L 24/06; H01L 24/07; H01L 24/10; H01L 24/12; H01L 24/14; H01L 24/15; H01L 24/27; H01L 24/28; H01L 24/30; H01L 24/31; H01L 24/33; H01L 33/48; H01L 33/486
USPC .......................... 257/783, 782; 438/118, 119
See application file for complete search history.

(56) References Cited

U.S. PATENT DOCUMENTS

| 5,844,314 | A  | 12/1998 | Kim |
| 6,777,071 | B2 | 8/2004  | Cobbley et al. |
| 7,023,095 | B2 | 4/2006  | Lee et al. |
| 7,088,005 | B2 | 8/2006  | Lee |

(Continued)

*Primary Examiner* — Sonya D McCall Shepard
*(74) Attorney, Agent, or Firm* — Downey Brand LLP

(57) ABSTRACT

Anisotropic conductive film (ACF) structures and manufacturing methods for forming the same are described. The manufacturing methods include preventing clusters of conductive particles from forming between adjacent bonding pads and that are associated with electrical shorting of ACF structures. In some embodiments, the methods involve use of multiple layered ACF materials that include a non-electrically conductive layer that reduces the likelihood of formation of conductive particle clusters between bonding pads. In some embodiment, the methods include the use of ultraviolet sensitive ACF material combined with lithography techniques that eliminate conductive particles from between neighboring bonding pads. In some embodiments, the methods involve the use of insulation spacers that block conductive particles from entering between bonding pads. Any suitable combination of the described methods can be used.

20 Claims, 12 Drawing Sheets

(56) References Cited

U.S. PATENT DOCUMENTS 8,043,709 B2 * 10/2011 Arifuku ................... C09J 9/02
                                                        156/273.9
2007/0242207 A1   10/2007  Fujita
2010/0001411 A1    1/2010  Sawada et al.

* cited by examiner

ANISOTROPIC CONDUCTIVE FILM STRUCTURES

FIELD

This disclosure relates generally to anisotropic conductive film (ACF) structures and methods for forming the same. In particular embodiments, the ACF structures are used in the manufacture of liquid crystal displays (LCDs).

BACKGROUND

Anisotropic conductive film (ACF) is an adhesive interconnect system that includes electrically conductive film. The electrically conductive film generally includes conductive particles dispersed within binder material. ACF is commonly used in the manufacture of liquid crystal displays (LCDs) to create the electrical connection between the display components and the integrated circuit (IC) components. In a typical LCD application, ACF is placed between electrodes of a display component and electrodes of an IC component. The display component and IC component are then pressed together such that an electrical and mechanical connection is made. The resulting structure is anisotropic in that there is unidirectional electrical connection between the display component and the IC component (z direction) but no electrical connection between adjacent electrodes of the display component or IC component.

A trend in new product designs is to reduce distances between bonding pads between electrodes of display components and IC components. This, however, can create problems using traditional ACF technologies. For example, the smaller distances between electrodes can result in higher probabilities of conductive particles of the conductive film to cluster between the electrodes and cause electrical shorts. What are needed, therefore, are improved anisotropic conductive film structures to accommodate current trends in LCD technology.

SUMMARY

This paper describes various embodiments that relate to manufacturing methods for anisotropic conductive film (ACF) structures. The systems and methods described can be used to manufacture ACF structures that are resistant to electrical shorting.

According to one embodiment, a method of electrically coupling a first contact on a first substrate to a second contact on a second substrate is described. The method includes arranging the first and second substrates on opposing sides of a multi-layer assembly such that the first and second contacts are aligned with each other. The multi-layer assembly including electrically conductive particles isotropically distributed within a first layer, and a non-electrically conductive second layer. The method also includes compressing the multi-layer assembly between the first and second substrates causing the electrically conductive particles to form an electrically conducting path between the first and second contacts.

According to another embodiment, a method of electrically coupling first bonding pads of a first substrate to second bonding pads of a second substrate is described. The method includes forming a patterned layer on the first substrate such that the patterned layer overlays the first bonding pads and has a shape in accordance with a pattern of the first bonding pads. The patterned layer includes conductive particles within a binding material. The method also includes positioning the first and second substrates such that the first and second bonding pads are aligned. The method further includes compressing the first and second substrates together such that the conductive particles form an electrically conductive path between the first and second bonding pads.

According to a further embodiment, a display assembly is described. The display assembly includes a first substrate bonded with a second substrate by an electrically conductive film. The first substrate has first bonding pads and the second substrate has second bonding pads. Conductive particles are positioned between the first bonding pads and the second bonding pads such that the first substrate is electrically coupled to the second substrate. The first substrate includes insulation spacers positioned between the first bonding pads, the insulation spacers preventing entry of the conductive particles between the first bonding pads.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
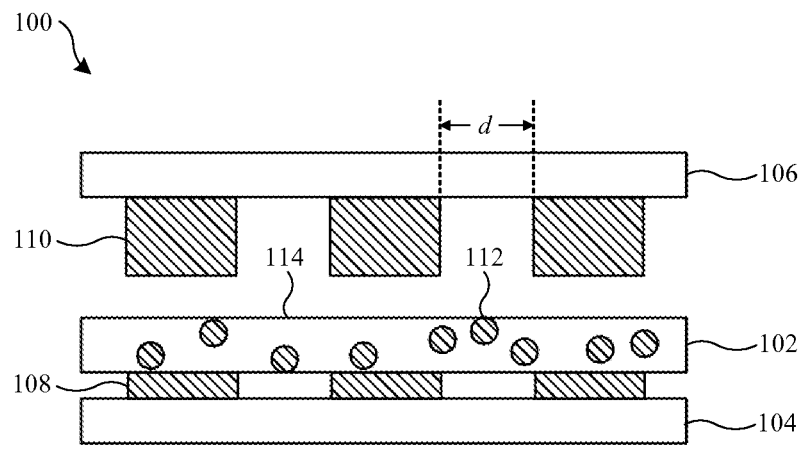
FIGS. 1A and 1B show cross-section views of an ACF structure during different stages of manufacture.

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

Described herein are manufacturing processes for forming anisotropic conductive film (ACF) structures with improved performance compared to traditional ACF structures. In particular, the ACF structures provided herein are resistant to shorting associated with clusters of conductive particles forming between adjacent conductive elements within bonded substrates. In some embodiments, the ACF structures are used in display assemblies, such as liquid crystal (LCD) assemblies.

The methods described are well suited for ACF structures having condensed bonding pad array patterns, as is the trend in current ACF product designs. In particular, as the number of the electronic components increases with newer product designs, the number of the bonding pads in each unit length in both display and integrated circuit (IC) substrates of LCD assemblies also increases correspondingly. These more condensed bonding pads arrays raise the challenge of creating spatially matched bonding pads of the display and IC substrates without formation of clusters of conductive particles with ACF structure that can crosslink neighboring bonding pads and result in electrical shorting within the ACF.

The methods described herein provide solutions for addressing these types of crosslinking and shorting problems. In some embodiments described herein, the ACF structures include multiple layers of material, with at least one non-electrically conductive layer that reduces the likelihood of formation of clusters of conductive particles between neighboring bonding pads. In some embodiments, the ACF structures include ultraviolet (UV) sensitive ACF material that can be combined with lithography techniques during the manufacturing process to form ACF structures that eliminate conductive particles between neighboring bonding pads. In some embodiments, the ACF structures include insulation spacers that block conductive particles from entering between neighboring bonding pads.

Methods described herein are well suited for use in the manufacture of consumer electronic products, such as in the manufacture of display assemblies for consumer electronics. For example, the methods described herein can be used in the manufacture of displays for computers, portable electronic devices, wearable electronic devices, and electronic device accessories, such as those manufactured by Apple Inc., based in Cupertino, Calif.

These and other embodiments are discussed below with reference to FIGS. 1A-9. However, those skilled in the art will readily appreciate that the detailed description given herein with respect to these Figures is for explanatory purposes only and should not be construed as limiting.

One of the challenges in the manufacture of modern display assemblies, such as LCD assemblies, relates to the reduction in size. In particular, distances between electrical traces and bonding pads within integrated circuits are becoming smaller and smaller, causing limitations when it comes to traditional ACF technologies. This problem is illustrated in FIGS. 1A-1B, showing manufacturing of ACF structure 100.

Figure 1B:
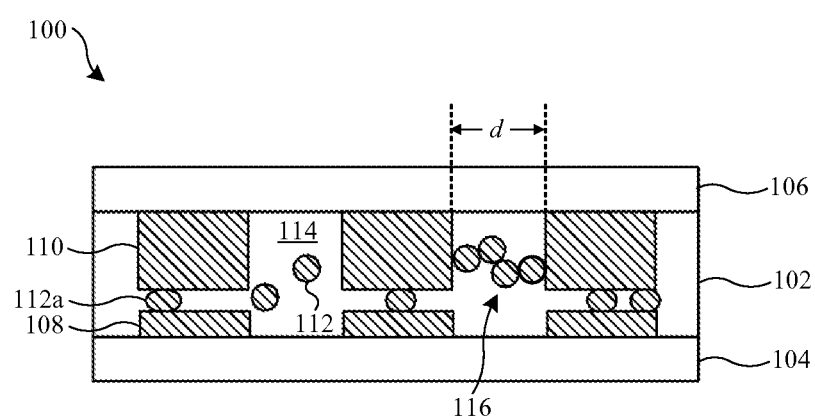

FIGS. 1A and 1B show cross-section views of ACF structure 100 during different stages of manufacture. At FIG. 1A, electrically conductive film 102 is positioned between first substrate 104 and second substrate 106. In the case of a display assembly, such as an LCD assembly, first substrate 104 can correspond to an integrated circuit (IC) substrate and second substrate 106 can correspond to a display substrate as part of a display assembly. In some embodiments, the IC substrate is a flexible circuit substrate. First substrate 104 includes first bonding pads 108 that are electrically coupled to an electrical circuit of first substrate 104. Likewise, second substrate 106 includes second bonding pads 110 that are electrically coupled to an electrical circuit of second substrate 106. Bonding pads 108 and 110 can be referred to as contact pads or contacts. Distance d corresponds to an average distance between adjacent first bonding pads 108 and second bonding pads 110.

Electrically conductive film 102 includes conductive particles 112 that are dispersed within binding material 114, which is typically an organic resin. In some embodiments, conductive particles 112 are isotropically distributed within binding material 114—that is conductive particles 112 are substantially evenly distributed within binding material 114. Conductive particles 112 generally have an average diameter on the scale of a few micrometers, with electrically conductive film 102 having a thickness on the scale of tens of micrometers. In one embodiment, conductive particles 112 have an average diameter of about 3 to 4 micrometers.

At FIG. 1B, first substrate 104 is bonded to second substrate 106 by compressing first substrate 104 and second substrate 106 together under high pressure and temperature conditions. For example, a bonding machine set at temperatures of about 100 to about 200 degrees Celsius can be used. The high temperature and pressure conditions cause the viscosity of electrically conductive film 102 to decrease and become liquefied. As such, binding material 114 spreads within the voids between first substrate 104 and second substrate 106. In addition, conductive particles 112 move with the flow of binding material 114 and become redistributed within the compressed space between first substrate 104 and second substrate 106. In this way, some of conductive particles 112, such as conductive particle 112a, get trapped between first bonding pads 108 and second bonding pads 110. In particular, particle 112a gets trapped between spatially matched first bond pad 108 and second bond pad 110. After some time (e.g., a few seconds), binding material 114 cools downs and becomes solid again. The resultant ACF structure 100 includes conductive particles 112 positioned between first bonding pads 108 and second bonding pads 110, thereby provide electrical conduction between the electrical circuit of first substrate 104 and the electrical circuit of second substrate 106.

In an ideal ACF structure, conductive particles 112 provide electrical conduction between first bonding pads 108 and second bonding pads 110, but not between adjacent bonding pads (e.g., between adjacent first bonding pads 108 or between adjacent second bonding pads 110). This preferential vertical or z-direction conduction is what gives ACF structure 100 its ideally anisotropic electrical conduction characteristic. However, when the distance d between first bonding pads 108 and/or second bonding pads 110 is small, such as in the case of modern fine-pitch bonding structures, there is a higher probability of conductive particles 112 to assembly or conglomerate together in clump 116 between adjacent bonding pads, such as adjacent second bonding pads 110 shown in FIG. 1B. For example, in some applications the average distance d (sometimes referred to as pitch) is about 30 micrometers or less. In a particular application, the average distance d is about 15 micrometers.

If clump 116 is assembled just right, this can provide an electrical path between adjacent second bonding pads 110, resulting in electrical shorting between adjacent second bonding pads 110 and thereby destroying the anisotropic nature of ACF structure 100. This type of electrical shorting is sometimes referred to as cross-linking. The smaller the distance d, the higher the probability of forming clump 116 that can cause such cross-linking problems. Note that clump 116 could accumulate between any adjacent bonding pads, such as between adjacent first bonding pads 108 of first substrate 104.

The embodiments described herein provide alternative ACF structures that reduce or eliminate the occurrence of the above-described cross-linking problems associated with fine-pitch bonding structures. In some embodiments, the ACF structures include multiple layers of material, described below with reference to FIGS. 2A-5. In some embodiments, the ACF structures include the use of an ultraviolet (UV) sensitive ACF material, described below with reference to FIGS. 6A-7. In some embodiments, the ACF structures include use of an insulation spacer, described below with reference to FIGS. 8A-9.

Multiple Layer ACF

As described above, in traditional ACF structures, the conductive particles of the electrically conductive film get trapped between adjacent bonding pads of fine-pitch bonding structures, causing the ACF to have a short circuit. One way to address this problem is by providing one or more extra layers of material other than the electrically conductive film between the substrates, and therefore can be referred to as multiple layered or multi-layered. Some of these embodiments are described below.

Figure 2A:
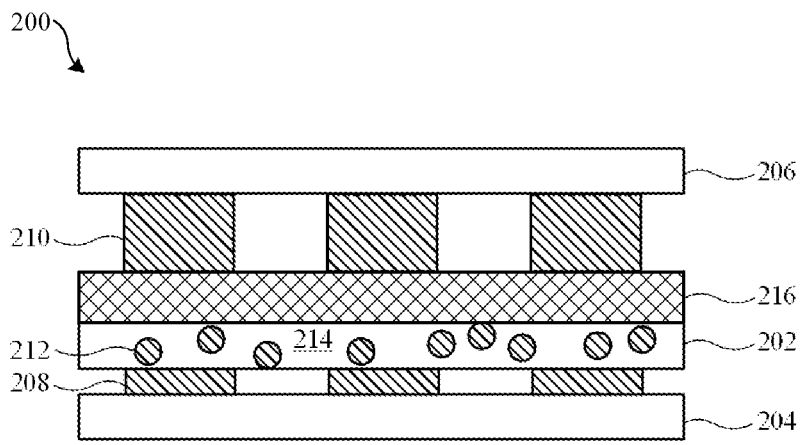
FIGS. 2A and 2B show cross-section views of a double layer ACF structure during different stages of manufacture.
Figure 2B:
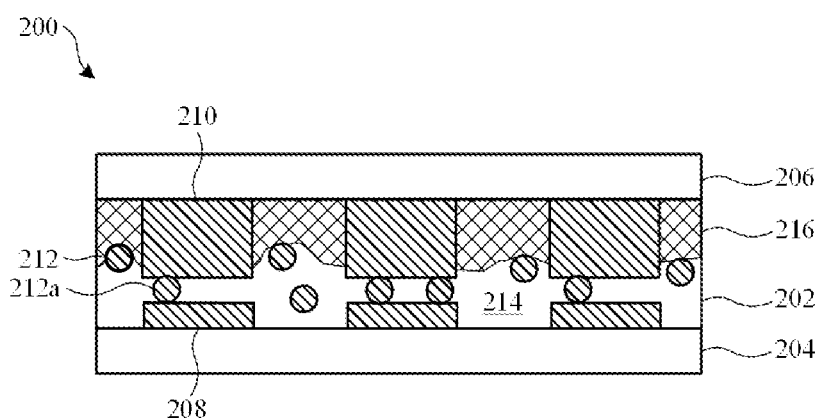

FIGS. 2A and 2B show cross-section views of ACF structure 200 that includes two layers during different stages of manufacture. At FIG. 2A, electrically conductive film 202 is positioned between first substrate 204 and second substrate 206. First substrate 204 includes first bonding pads 208 and second substrate 206 includes second bonding pads 210. Electrically conductive film 202 includes conductive particles 212 (e.g., metal and/or graphite) dispersed within binding material 214.

Unlike traditional ACF structures, ACF structure 200 includes non-electrically conductive film 216, positioned between electrically conductive film 202 and second substrate 206. Note that in other embodiments, non-electrically conductive film 216 is positioned between electrically conductive film 202 and first substrate 204. Compared to electrically conductive film 202, non-electrically conductive film 216 is substantially non-electrically conductive and does not include conductive particles 212. In some embodiments, non-electrically conductive film 216 is made of a resin material. In some embodiments, the material of non-electrically conductive film 216 is the same as binding material 214 of electrically conductive film 202. In other embodiments, the material of non-electrically conductive film 216 has a lower viscosity than the viscosity of binding material 214.

At FIG. 2B, first substrate 204 and second substrate 206 are compressed under high pressure and temperature conditions such that electrically conductive film 202 and non-electrically conductive film 216 liquefy and flow within spaces between first substrate 204 and second substrate 206. This flow causes some conductive particles 212, such as conductive particle 212a, to become trapped between first bonding pads 208 and second bonding pads 210, thereby providing electrical coupling of an electrical circuit of first substrate 204 and an electrical circuit of second substrate 206. In addition, non-electrically conductive film 216 takes up part of the space between second bonding pads 210 that electrically conductive film 202 would otherwise take up.

By providing a non-electrically conductive film 216 having a lower viscosity than binding material 214 of electrically conductive film 202, non-electrically conductive film 216 flows between second bonding pads 210 faster than electrically conductive film 202, thereby preventing conductive particles 212 from flowing between second bonding pads 210. Thus, non-electrically conductive film 216 can be referred to as a buffer layer. In some cases, more conductive particles 212 will be trapped between bonding pads 208 and 210, thereby potentially providing better electrical coupling between substrates 204 and 206. In addition, since conductive particles 212 are prevented from entering between second bonding pads 210, or at least reducing the probability of conductive particles 212 entering between second bonding pads 210, the likelihood of clusters of conductive particles 212 forming between second bonding pads 210 is eliminated or reduced.

In some cases, a single layer of non-electrically conductive film is not sufficient to provide adequately reduce the occurrence of cross-linking. For example, in some structures there may still be a likelihood of conductive particles 212 to flow in between first bonding pads 208 of first substrate 204.

Figure 3A:
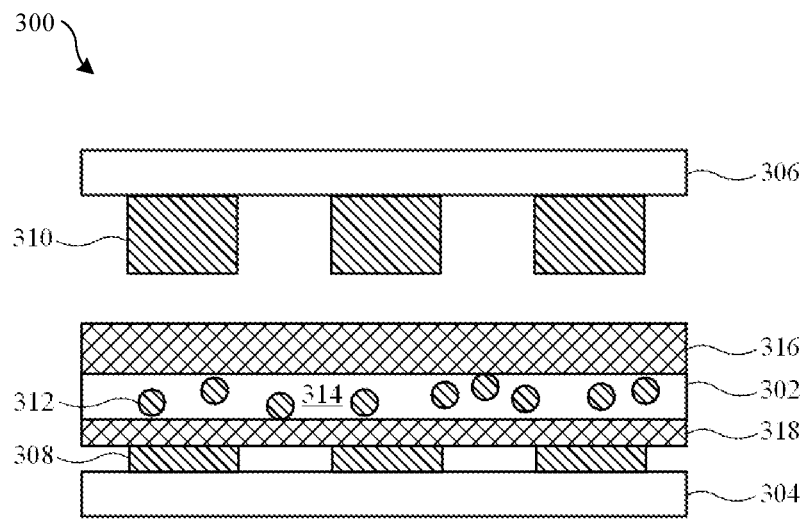
FIGS. 3A and 3B show cross-section views of a triple layer ACF structure during different stages of manufacture.
Figure 3B:
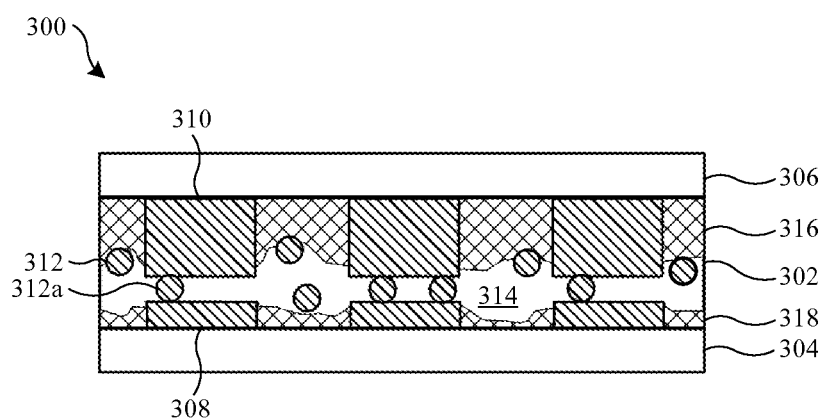

To prevent this possibility, FIGS. 3A and 3B show cross-section views of triple layer ACF structure 300, in accordance with some embodiments. At FIG. 3A, electrically conductive film 302, first non-electrically conductive film 316, and second non-electrically conductive film 318 are positioned between first substrate 304 and second substrate 306. In some embodiments, first non-electrically conductive film 316 and second non-electrically conductive film 318 each have lower viscosity that binding material 314 of electrically conductive film 302.

At FIG. 3B, first substrate 304 and second substrate 306 are compressed under high pressure and temperature conditions such that electrically conductive film 302, first non-electrically conductive film 316, and second non-electrically conductive film 318 liquefy and flow within spaces between first substrate 304 and second substrate 306. This flow causes some conductive particles 312, such as conductive particle 312a, to become trapped between first bonding pads 308 and second bonding pads 310, thereby electrical coupling the electrical circuit of first substrate 304 and the electrical circuit of second substrate 306. In addition, first non-electrically conductive film 316 takes up space between second bonding pads 310 and second non-electrically conductive film 318 takes up space between first bonding pads 308. This reduces the number of conductive particles 312 of electrically conductive film 302 from entering between adjacent first bonding pads 308 or between adjacent second bonding pads 310, thereby reducing or eliminating crosslink shorting described above.

Figure 4A:
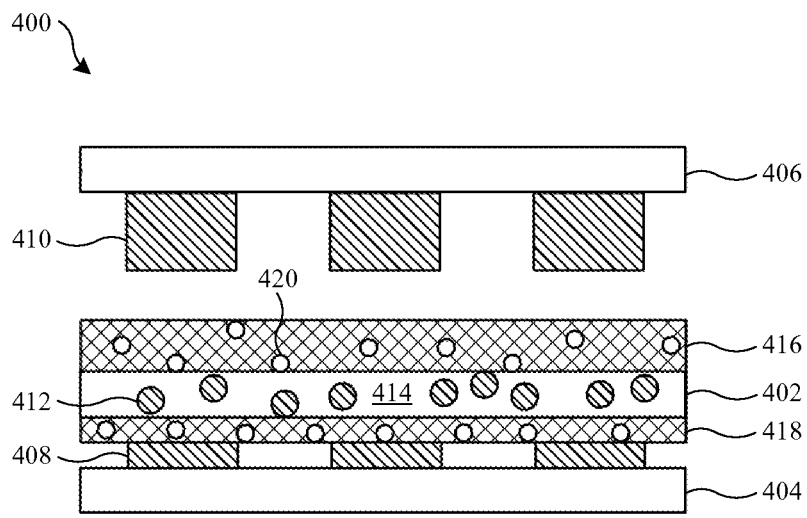
FIGS. 4A and 4B show cross-section views of a triple layer ACF structure having electrically non-conductive particles during different stages of manufacture.
Figure 4B:
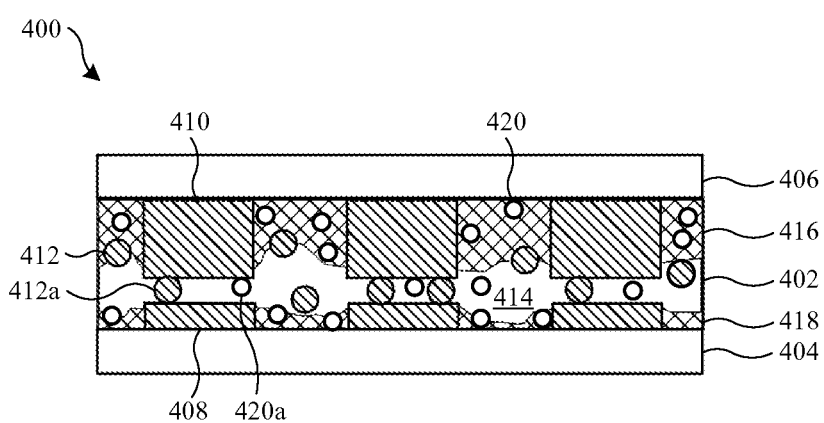

In some embodiments, the non-electrically conductive films include electrically non-conductive particles to enhance performance of the triple layer ACF. FIGS. 4A and 4B show cross-section views of a triple layer ACF structure 400 having electrically non-conductive particles 420, in accordance with some embodiments. It should be noted that that non-conductive particles 420 can also be used in the double ACF layer described above with reference to FIGS. 2A and 2B.

At FIG. 4A, electrically conductive film 402, first non-electrically conductive film 416, and second non-electrically conductive film 418 are positioned between first substrate 404 and second substrate 406. In some embodiments, first non-electrically conductive film 416 and second non-electrically conductive film 418 each have lower viscosity that binding material 414 of electrically conductive film 402. Each of first non-electrically conductive film 416 and second non-electrically conductive film 418 includes non-conductive particles 420, which can be made of any suitable non-electrically conductive material, such as one or more polymer materials and/or certain ceramic materials.

At FIG. 4B, first substrate 404 and second substrate 406 are compressed under high pressure and temperature conditions, similar to the ACF structures described above. Some of conductive particles 412, such as conductive particle 412a, are trapped between first bonding pads 408 and second bonding pads 410, thereby electrically coupling first substrate 404 with second substrate 406. In addition, non-conductive particles 420 are distributed between adjacent first bonding pads 408 and between adjacent second bonding pads 410. This further reduces the probability of clusters of conductive particles 412 to form between adjacent first bonding pads 408 and between adjacent second bonding pads 410, thereby further reducing or eliminating the occurrence of crosslink shorting. If first non-electrically conductive film 416 and second non-electrically conductive film 418 have lower viscosity that electrically conductive film 402, these films 416 and 418 can flow at a faster rate under the pressure compared to electrically conductive film 402. In this way, non-conductive particles 420 can have, on average, a higher mobility than conductive particles 412.

The size of non-conductive particles 420 can vary depending on design requirements. In some embodiments, the non-conductive particles 420 have an average diameter less than the average diameter of conductive particles 412 so as not to interfere with the electrical conduction that conductive particles 412 provide. For example, insulating particle 420a, which is positioned between first bonding pads 408 and second bonding pads 410, has a smaller diameter than conductive particle 412a and therefore does not interfere with electrical conduction through conductive particle 412a.

Figure 5:
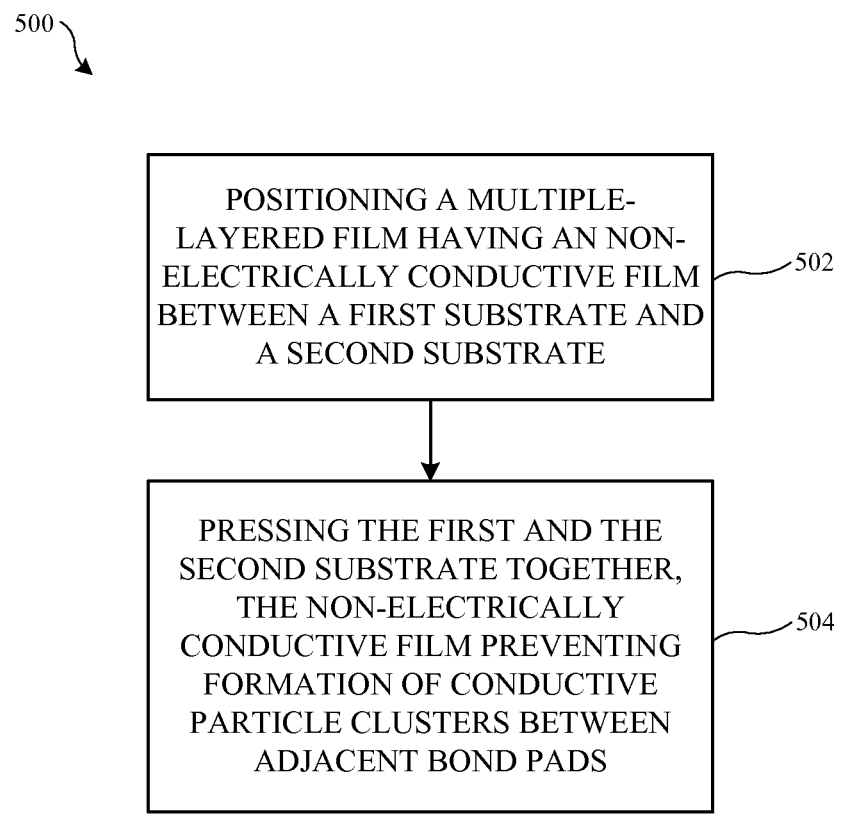
FIG. 5 shows a flowchart indicating a process of forming a multiple-layered ACF structure.

FIG. 5 shows flowchart 500 indicating a process of forming a multiple-layered ACF structure, in accordance with some embodiments. At 502, a multiple-layered film is positioned between a first substrate and a second substrate. The first substrate has first bonding pads and the second substrate has second bonding pads. The multiple-layered film includes an electrically conductive film and a non-electrically conductive film. The electrically conductive film has conductive particles within a binding material. In some embodiments, the multiple-layered film includes two non-electrically conductive films positioned adjacent to opposing sides of the electrically conductive film. In some embodiments, the one or more non-electrically conductive films include non-conductive particles.

At 504, the first and second substrates are pressed together such that the non-electrically conductive film prevents formation of conductive particle clusters between adjacent first bonding pads or adjacent second bonding pads. As described above, conductive particle clusters positioned between adjacent bonding pads are associated with forming electrical shorts within the ACF structure.

UV Sensitive ACF Material and Lithography Assisted ACF Bonding

A further way to address the crosslink shorting problems described above is by using an ultraviolet (UV) light sensitive ACF material, where aspects of ACF techniques are combined with aspects of photoresist lithography techniques. FIGS. 6A-6E show cross-section views of ACF structure 600 formed using UV sensitive ACF material, in accordance with some embodiments.

Figure 6A:
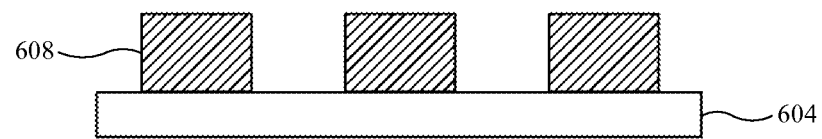
FIGS. 6A-6E show cross-section views of an ACF structure with UV sensitive ACF material during different stages of manufacture.
Figure 6B:
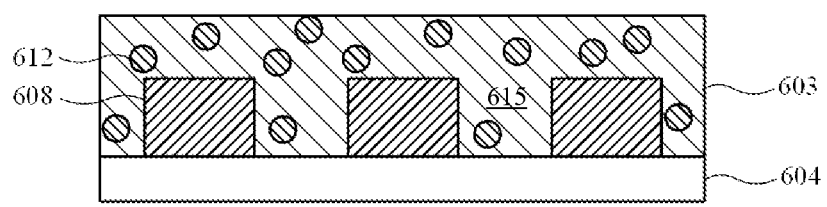

At FIG. 6A, first substrate 604 having first bonding pads 608 is provided. First bonding pads 608 provide electrical access to one or more electrical circuits of first substrate 604. First substrate 604 can correspond to an IC substrate or a display substrate as part of a display assembly (e.g., LCD assembly). At FIG. 6B, first substrate 604 is coated with UV sensitive ACF 603. UV sensitive ACF 603 includes conductive particles 612 embedded within UV sensitive binding material 615. In some embodiments, UV sensitive binding material 615 is a UV sensitive resin, such as a negative or positive photoresist material.

Figure 6C:
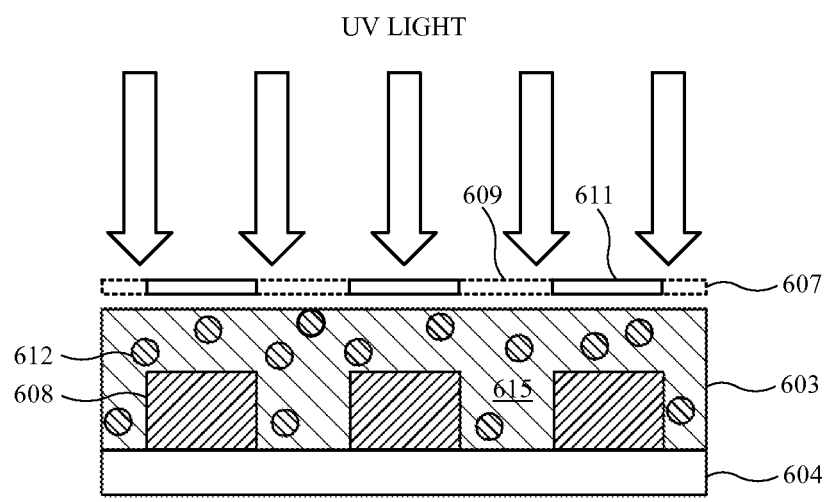

At FIG. 6C, a portion of UV sensitive ACF 603 is exposed to UV light. In particular, mask 607 has a pattern of openings 609 corresponding to the pattern of first bonding pads 608. Openings 609 allow underlying portions of ACF 603 to be exposed to UV light, while opaque portions 611 of mask 607 block other portions of UV sensitive ACF 603 from UV light. In the instant embodiment, UV sensitive binding material 615 is a positive type of photoresist such that portions of UV sensitive ACF 603 exposed to UV light become more soluble in a subsequently applied developer solution. Alternatively, UV sensitive binding material 615 can be a negative type of photoresist that becomes insoluble when exposed to UV light—in which case, mask 607 would have an opposite pattern with openings 609 corresponding to opaque portions and opaque portions 611 corresponding to openings.

Figure 6D:
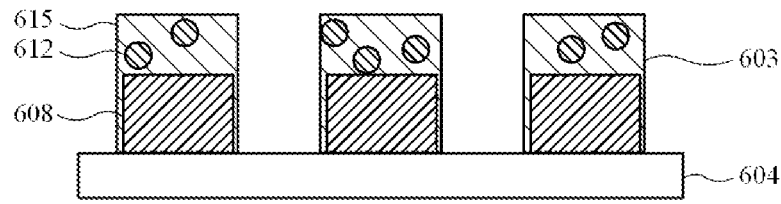

At FIG. 6D, UV sensitive ACF 603 is exposed to a developer solution such that portions of UV sensitive ACF 603 above first bonding pads 608 remain and most or all of UV sensitive ACF 603 between first bonding pads 608 are removed, including the conductive particles 612 in the removed portion of UV sensitive ACF 603. In this way, after the UV patterning and development, conductive particles 612 are completely removed from the spaces between first bonding pads 608. In some embodiments, first substrate 604 is ready for bonding with a second substrate. In other embodiments, a separate binding material is applied on and/or around UV sensitive ACF 603 to assist subsequent bonding.

Figure 6E:
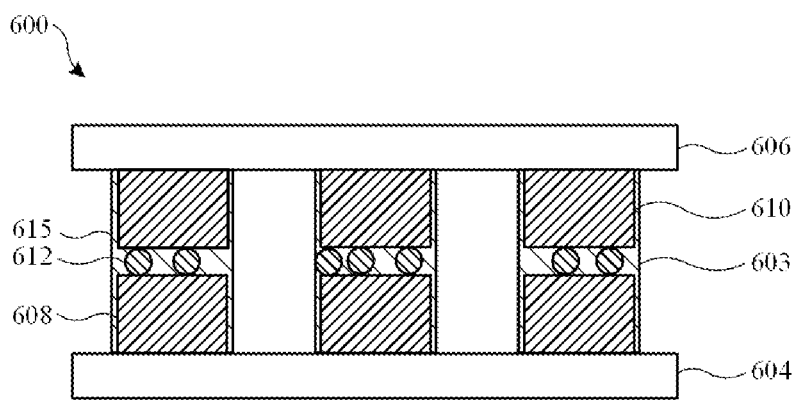

At FIG. 6E, second substrate 606 is positioned over and pressed with first substrate 604 under high pressure and temperature conditions, similar to the ACF structures described above. It should be noted, however, that UV sensitive binding material 615 might have different liquefying temperatures than more traditional types of binding material. Therefore, the pressure and temperature conditions should be adjusted accordingly. Since conductive particles 612 are already positioned over first bonding pads 608 prior to the bonding, most or all of conductive particles 612 become trapped between first bonding pads 608 and second bonding pads 610. Conductive particles 612 thereby electrically couple first substrate 604 with second substrate 606 with substantially no conductive particles 612 between adjacent first bonding pads 608 or second bonding pads 610.

Compared with the traditional ACF processes, use of UV sensitive ACF 603 and the above-described pre-bonding process can not only prevent the issue of crosslinking in neighboring bonding pads 608 and 610 by eliminating conductive particles 612 in between them, but also accurately deliver conductive particles 612 on top first bonding pads 608, thereby effectively managing the locations of conductive particles 612 instead of randomly distributing conductive particles 612 across the whole of substrates 604 and 606 as in the traditional ACF procedures. This can allow for more overall conductive particles 612 to be trapped between bond pads 608 and 610, and thereby increase the electrical conductivity between substrates 604 and 606 compared to traditional ACF techniques.

Figure 7:
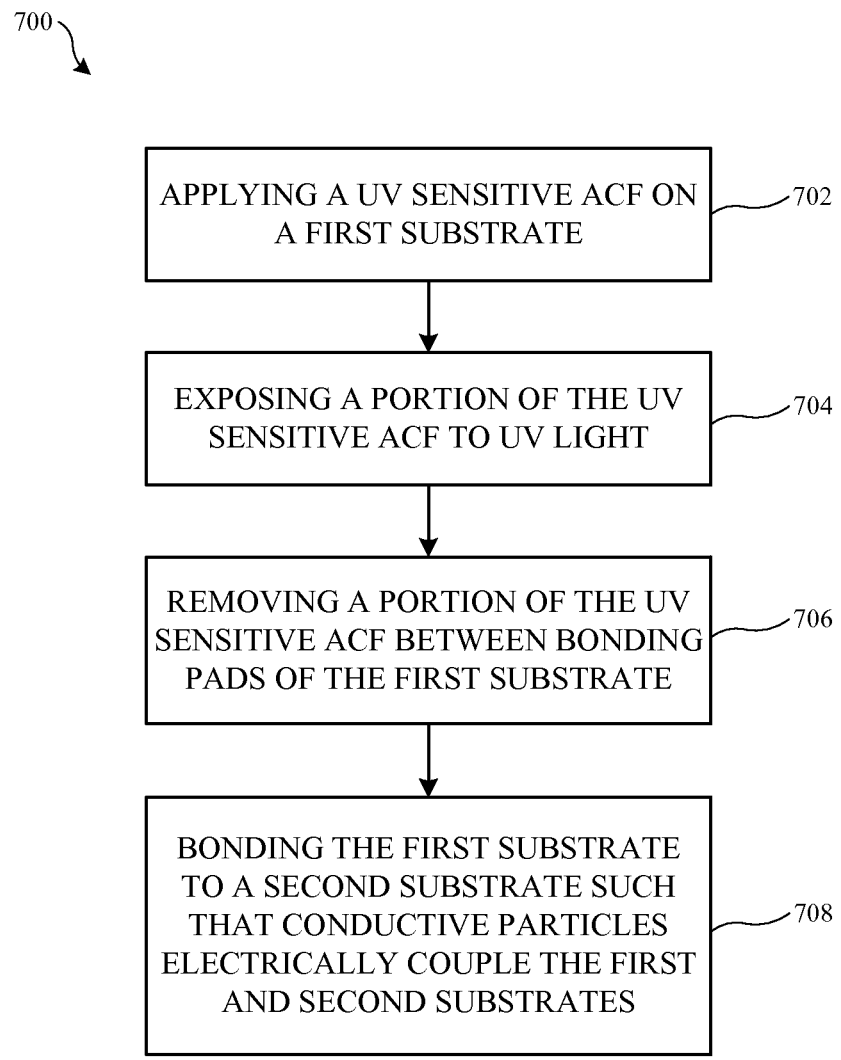
FIG. 7 shows a flowchart indicating a process of forming an ACF structure using a UV sensitive ACF material.

FIG. 7 shows flowchart 700 indicating a process of forming an ACF structure using a UV sensitive ACF material, in accordance with some embodiments. At 702, a UV sensitive ACF is applied on a first substrate having first bonding pads. In some embodiments, the first substrate corresponds to a display substrate or IC substrate of a display assembly for an electronic device. The UV sensitive ACF includes conductive particles within a UV sensitive binding material. The UV sensitive binding material can include a positive or negative type of photoresist material.

At 704, a portion of UV sensitive ACF is exposed to UV light in accordance with a pattern of the first bonding pads. A mask having openings and opaque regions can be used to expose appropriate portions of the UV sensitive ACF. At 706, a portion of the UV sensitive ACF between first bonding pads of the first substrate is removed. If the UV sensitive ACF includes a positive type photoresist, the removed portion of UV sensitive ACF will correspond to the UV exposed portion. If the UV sensitive ACF includes a negative type photoresist, the removed portion of UV sensitive ACF will correspond to the portion blocked from UV exposure. After removal, the UV sensitive ACF will have a patterned shape in accordance with the first bonding pads, with conductive particles positioned over the first bonding pads. In some embodiments, the one or more additional layers of binding material are applied onto the UV sensitive ACF prior to bonding at 708.

At 708, the first substrate is bonded with a second substrate having second bonding pads. The first bonding pads are aligned with the second bonding pads such that the conductive particles electrically couple the first substrate with the second substrate. Since the conductive particle are not positioned between adjacent first bonding pads or adjacent second bonding pads, clusters of conductive particles do not form between adjacent first bonding pads and adjacent second bonding pads, thereby preventing formation of electrical shorts within the ACF structure.

Insulation Spacer Incorporated ACF Bonding

A further way to address the crosslink shorting problems described above is by providing insulation spacers within the ACF structures. FIGS. 8A-8H show cross-section views of ACF structure 800 having insulation spacers being formed, in accordance with some embodiments.

Figure 8A:
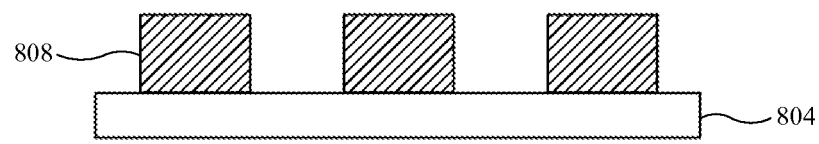
FIGS. 8A-8H show cross-section views of an ACF structure having insulation spacers during different stages of manufacture.
Figure 8B:
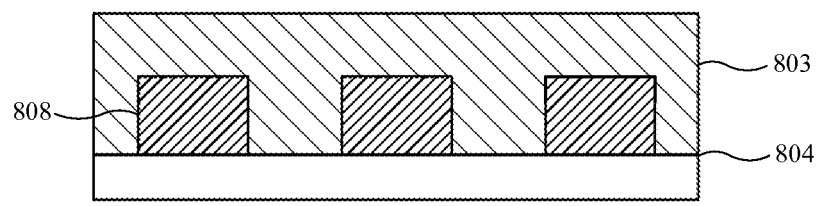

At FIG. 8A, first substrate 804 having first bonding pads 808 is provided. First bonding pads 808 provide electrical access to one or more electrical circuits of first substrate 804. First substrate 804 can correspond to an IC substrate or a display substrate as part of a display assembly (e.g., LCD assembly). At FIG. 8B, first substrate 804 is coated with photoresist 803. Photoresist 803 can include any suitable photoresist material or materials, such as resins that are UV sensitive (e.g., negative or positive photoresist material).

Figure 8C:
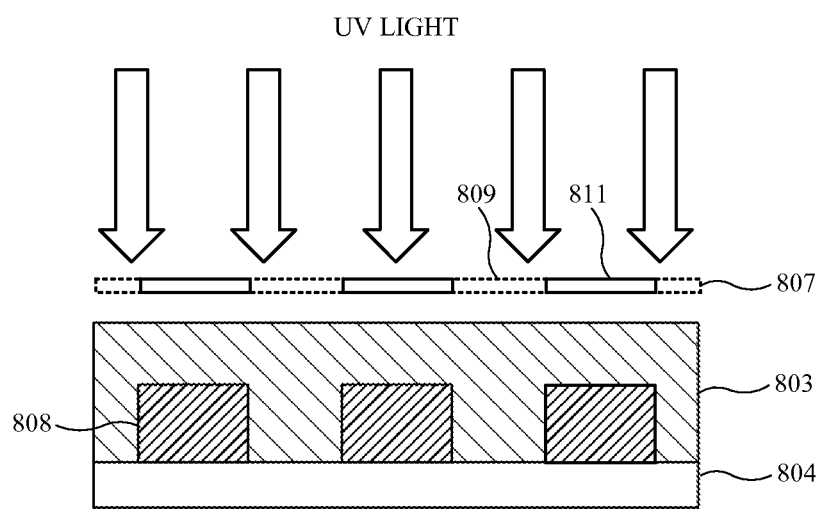
Figure 8D:
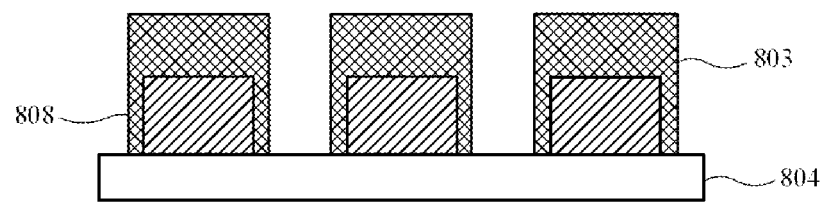
Figure 8E:
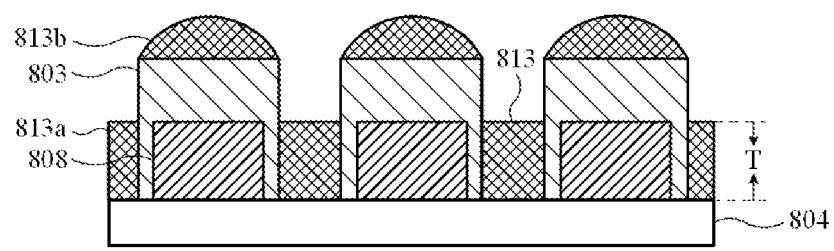

At FIG. 8C, photoresist 803 is exposed to UV light. Mask 807 is positioned over first substrate 804 such that openings 809 and opaque portions 811 of mask 807 are arranging in a pattern in accordance with the locations of bonding pads 808. Openings 809 allow underlying portions of photoresist 803 to be exposed to UV light, while opaque portions 811 block other portions of photoresist 803 from UV light. In the embodiment shown in FIGS. 8A-8H, photoresist 803 is a positive type of photoresist such that those portions exposed to UV light become more soluble in a subsequently applied developer solution. In other embodiments, photoresist 803 is a negative type of photoresist that becomes insoluble when exposed to UV light—in which case, mask 807 would have an appropriate pattern.

At 8D, photoresist 803 is exposed to a developer solution such that most of photoresist 803 between first bonding pads 808 is removed and portions above first bonding pads 608 remain. At 8E, insulation material 813 is deposited onto first substrate 804 and photoresist 803. As shown, first portion 813a of insulation material 813 can be deposited on exposed substrate 804 and second portion 813b of insulation material 813 is deposited on photoresist 803. Insulation material 813 can be made of any suitable electrically insulating material that can be deposited, using for example spraying, sputtering or other suitable deposition technique. In some embodiments, insulation material 813 includes ceramic material (e.g., aluminum oxide or other oxide material). The amount of insulation material 813 deposited on substrate 804 can be chosen to achieve a desired thickness T. In some embodiments, thickness T of insulation material 813 is substantially the same as the thickness of first bonding pads 808. In other embodiments, thickness T is chosen such that insulation material 813 extends above a top surface of bonding pads 808.

Figure 8F:
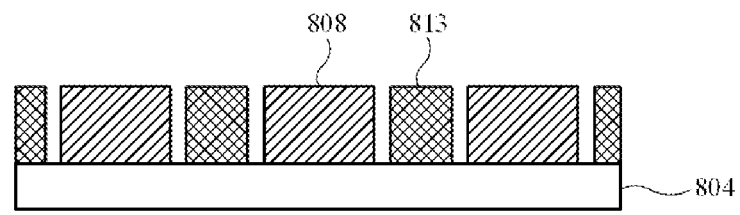
Figure 8G:
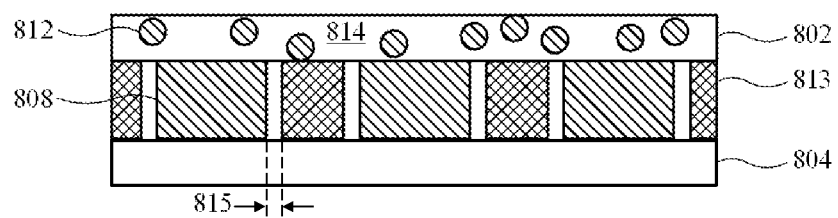
Figure 8H:
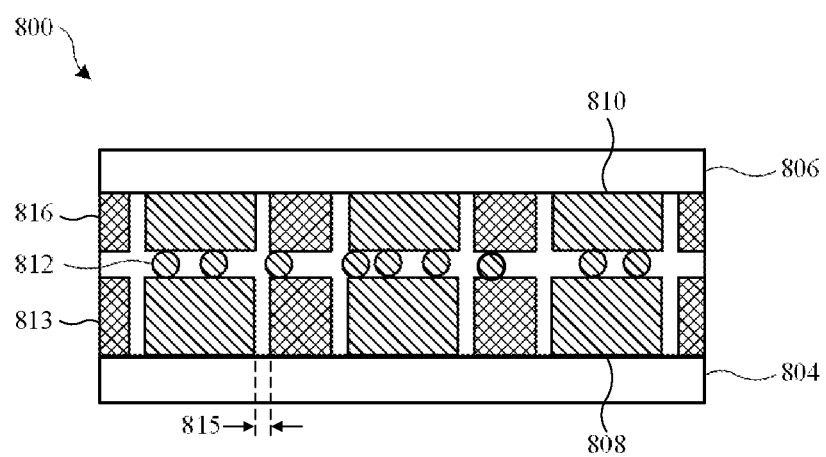

At FIG. 8F, photoresist 803 and second portion 813b of insulation material 813 are removed using, for example, a photoresist removal washing process. This leaves insulation material 813 positioned in the spaces between bonding pads 808. Thus, insulation material 813 can be referred to as insulation spacers. Note that in some embodiments, insulation spacers 813 are not deposited in between every neighboring bonding pad 808, but instead every few bonding pads 808, such as every two neighboring bonding pads 808.

At 8G, electrically conductive film 802 is applied on first substrate 804, e.g., on insulation spacers 813 and first bonding pads 808. Electrically conductive film 802 includes conductive particles 812 within binding material 814. An average diameter of conductive particles 812 can be chosen to larger than an average spacing 815 between adjacent insulation spacers 813 and first bonding pads 808. Note that in some embodiments spacing 815 is substantially zero and first bonding pads 808 contact adjacent spacers 813. However, in practicality the lithography process described above with reference to FIG. 8C may include tolerance such that spacing 815 may not be zero.

At 8H, second substrate 806 is positioned over and pressed with first substrate 804 under high pressure and temperature conditions, similar to the ACF structures described above. Second substrate 806 has been processed similar to first substrate 804 such that second insulation spacers 816 are positioned between second bonding pads 810 of second substrate 806. Second substrate 806 is bonded with first substrate 804 such that conductive particles 812 become trapped between first bonding pads 608 and second bonding pads 610, thereby electrically coupling first substrate 804 and second substrate 806. Insulation spacers 813 prevent conductive particles 812 from entering between first bonding pads 808. In particular, since average spacing 815 between adjacent insulation spacers 813 and first bonding pads 808 is smaller than the average diameter of conductive particles 812, conductive particles 812 cannot enter. Similarly second insulation spacers 816 prevent conductive particles 812 from entering between second bonding pads 810. In this way, insulation spacers 813 and second insulation spacers 816 prevent clustering of conductive particles 812 between first bonding pads 808 or between second bonding pads 810, thereby preventing crosslink shorting of ACF structure 800.

Figure 9:
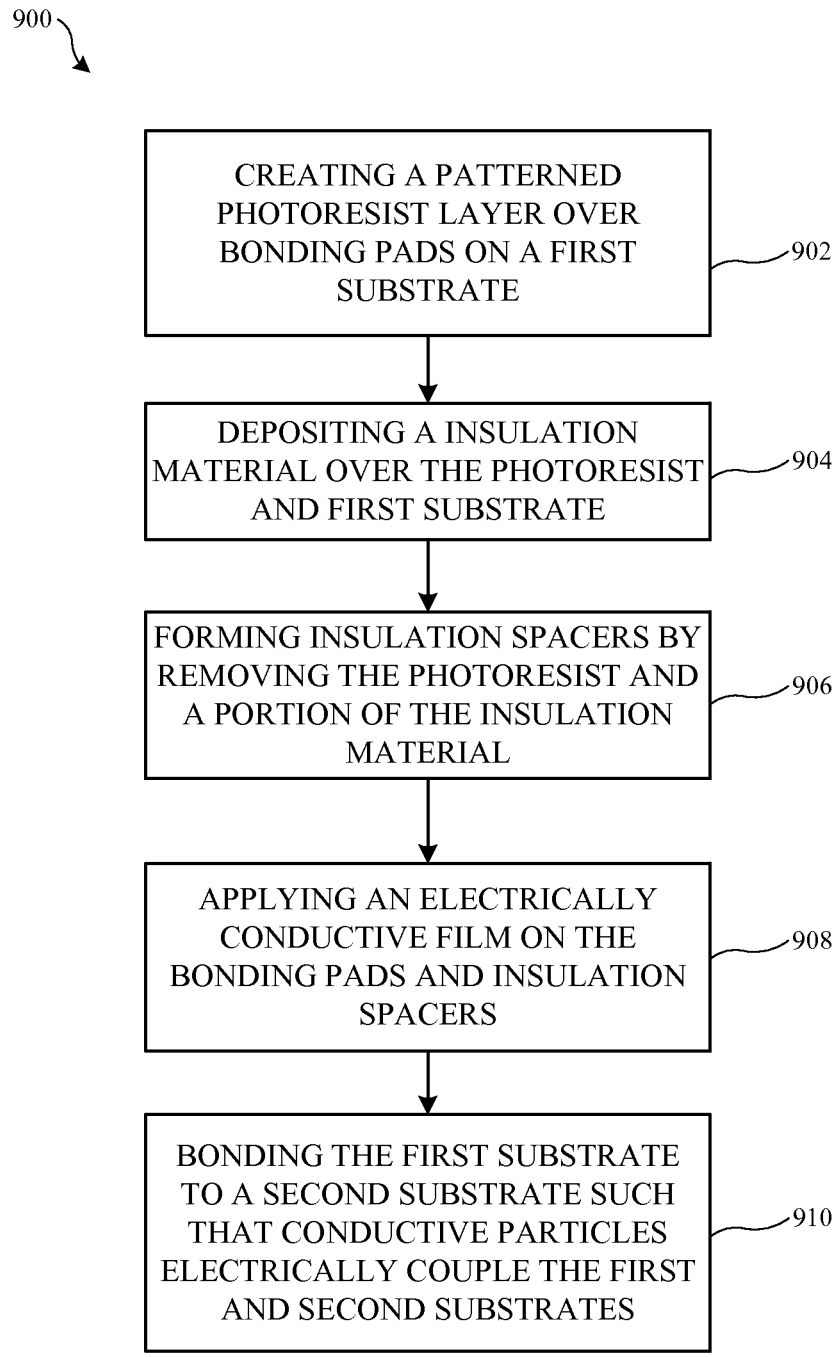
FIG. 9 shows a flowchart indicating a process of forming an ACF structure having insulation spacers.

FIG. 9 shows flowchart 900 indicating a process of forming an ACF structure having insulation spacers, in accordance with some embodiments. At 902, a patterned photoresist layer is created over a pattern of bonding pads on a first substrate. This can be accomplished using photolithography techniques described above. At 904, an insulation material is deposited over the photoresist and exposed surfaces of the first substrate. In some embodiments, the insulation material includes an oxide material.

At 906, removing the photoresist and a portion of the insulation material deposited on the photoresist forms insulation spacers between the bonding pads. At 908, an electrically conductive film is applied on the bonding pads and the insulation spacers. In some embodiments, an average space between adjacent insulation spacers and bonding pads is less than an average diameter of conductive particles.

At 910, the first substrate is bonded with a second substrate having insulation spacers positioned between corresponding bonding pads. The bonding pads of the first substrate are aligned with the bonding pads of the second substrate such that the conductive particles electrically couple the first substrate with the second substrate. The insulation spacers of the first substrate prevent conductive particles from entering between adjacent bonding pads of the first substrate. Likewise, the insulation spacers of the second substrate prevent conductive particles from entering between adjacent bonding pads of the second substrate. In this way, clusters of conductive particles do not form between bonding pads of the first substrate and between bonding pads of the second substrate, thereby preventing formation of electrical shorts within the ACF structure.

Note that suitable combinations of any of the methods described above can be combined to form an ACF structure. For example, in some embodiments, UV sensitive ACF material is combined with formation of insulation spacers. Likewise, in some embodiments, multiple layer ACF is used in combination with formation of insulation spacers. Further, in some embodiments, multiple layer ACF is used in combination with UV sensitive ACF material.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A method of assembling a display assembly, the method comprising:
   arranging an electrically conductive film between a first substrate having first bonding pads and a second substrate having second bonding pads, the electrically conductive film including electrically conductive particles, wherein insulation spacers positioned between the first bonding pads are separated from the first bonding pads by gaps; and
   compressing the first and second substrates, thereby causing the electrically conductive particles to form an electrically conducting path between the first and second substrates, wherein widths of the gaps are generally smaller than diameters of the electrically conductive particles, thereby preventing the electrically conductive particles from entering the gaps.

2. The method of claim 1, further comprising arranging a non-electrically conductive film between the first substrate and the second substrate.

3. The method of claim 1, wherein a distance between the first bonding pads is about 30 micrometers.

4. The method of claim 1, wherein a thickness of the insulation spacers is substantially the same as a thickness of the first bonding pads.

5. The method of claim 1, wherein the electrically conductive film includes binding material that flow within the gaps.

6. The method of claim 2, wherein the non-electrically conductive film includes non-conductive particles.

7. The method of claim 2, wherein the first substrate corresponds to a display component and the second substrate corresponds to an integrated circuit.

8. The method of claim 2, wherein the insulation spacers are first insulation spacer, wherein second insulation spacers are positioned between the second bonding pads.

9. The method of claim 6, wherein the non-conductive particles are smaller than the electrically conductive particles.

10. A display assembly, comprising:
    a first substrate bonded with a second substrate by an electrically conductive film, the first substrate having first bonding pads and the second substrate having second bonding pads, wherein conductive particles within the electrically conductive film are positioned between the first bonding pads and the second bonding pads such that the first substrate is electrically coupled to the second substrate; and
    insulation spacers positioned between the first bonding pads and separated from the first bonding pads by gaps, wherein widths of the gaps are generally smaller than the diameters of the conductive particles a thereby preventing the conductive particles from entering the gaps.

11. The display assembly of claim 10, wherein the first substrate corresponds to a display component and the second substrate corresponds to an integrated circuit.

12. The display assembly of claim 10, wherein the second substrate includes second insulation spacers positioned between the second bonding pads.

13. The display assembly of claim 10, wherein the insulation spacers are composed of a ceramic material.

14. The display assembly of claim 10, wherein a thickness of the insulation spacers is substantially the same as a thickness of the first bonding pads.

15. The display assembly of claim 13, wherein an average diameter of the conductive particles is about 3 to 4 micrometers.

16. A display assembly, comprising:
    a first substrate having first bonding pads and insulation spacers between the first bonding pads, wherein the insulation spacers are separated from the first bonding pads by gaps; a second substrate having second bonding pads;
    a binding material between the first substrate and the second substrate, the binding material binding the first substrate to the second substrate; and
    conductive particles between the first bonding pads and the second bonding pads, thereby electrically coupling the first bonding pads with the second bonding pads, wherein widths of the gaps are generally smaller than diameters of the conductive particles.

17. The display assembly of claim 16, wherein the insulation spacers are composed of a ceramic material.

18. The display assembly of claim 16, wherein the insulation spacers are first insulation spacer, wherein second insulation spacers are between the second bonding pads.

19. The display assembly of claim 16, wherein the binding material is a resin.

20. The display assembly of claim 16, further comprising non-conductive particles.

* * * * *